US010696541B2

(12) United States Patent
Endean et al.

(10) Patent No.: US 10,696,541 B2
(45) Date of Patent: Jun. 30, 2020

(54) SYSTEMS AND METHODS FOR BIAS SUPPRESSION IN A NON-DEGENERATE MEMS SENSOR

(71) Applicant: Honeywell International Inc., Morris Plains, NJ (US)

(72) Inventors: Daniel Endean, Plymouth, MN (US); John Reinke, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 84 days.

(21) Appl. No.: 15/466,778

(22) Filed: Mar. 22, 2017

(65) Prior Publication Data

US 2018/0118557 A1    May 3, 2018

Related U.S. Application Data

(60) Provisional application No. 62/342,132, filed on May 26, 2016.

(51) Int. Cl.
*G01C 19/574* (2012.01)
*G01C 19/5719* (2012.01)
(Continued)

(52) U.S. Cl.
CPC .......... *B81B 3/0021* (2013.01); *B81B 3/0072* (2013.01); *B81B 7/0058* (2013.01);
(Continued)

(58) Field of Classification Search
CPC .............. G01C 19/574; G01C 19/5712; G01C 19/5719; G01C 19/5747; G01C 19/5726
See application file for complete search history.

(56) References Cited

U.S. PATENT DOCUMENTS 5,349,855 A    9/1994  Bernstein et al.
6,151,965 A   11/2000  Watarai
(Continued)

FOREIGN PATENT DOCUMENTS

CA    2548728    10/2009
CA    2756485     8/2018
(Continued)

OTHER PUBLICATIONS

Senkal et al., "Minimal Realization of Dynamically Balanced Lumped Mass WA Gyroscope: Dual Foucault Pendulum", "MicroSystems Laboratory, University of California", 2015, pp. 1-2, Publisher: IEEE, Published in: Irvine, CA, USA.
(Continued)

*Primary Examiner* — Helen C Kwok
(74) *Attorney, Agent, or Firm* — Fogg & Powers LLC (57) ABSTRACT

Systems and methods for suppressing bias in a non-degenerate vibratory structure are provided. In certain embodiments, a vibratory structure includes a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

17 Claims, 7 Drawing Sheets

(51) Int. Cl.
*G01C 19/5747* (2012.01)
*B81B 3/00* (2006.01)
*B81B 7/00* (2006.01)

(52) U.S. Cl.
CPC ....... *G01C 19/574* (2013.01); *G01C 19/5719* (2013.01); *G01C 19/5747* (2013.01); *B81B 2201/0242* (2013.01); *B81B 2203/0118* (2013.01)

(56) References Cited

U.S. PATENT DOCUMENTS

| | | | |
|---|---|---|---|
| 6,308,567 | B1 | 10/2001 | Higuchi et al. |
| 6,742,390 | B2 | 6/2004 | Mochida et al. |
| 6,837,107 | B2 | 1/2005 | Geen |
| 6,848,304 | B2 | 2/2005 | Geen |
| 7,032,451 | B2 | 4/2006 | Geen |
| 7,036,373 | B2 | 5/2006 | Johnson et al. |
| 7,100,446 | B1 | 9/2006 | Acar et al. |
| 7,401,397 | B2 | 7/2008 | Shcheglov et al. |
| 7,810,394 | B2 | 10/2010 | Yazdi |
| 7,905,146 | B2 | 3/2011 | Suzuki |
| 8,006,557 | B2 | 8/2011 | Yin et al. |
| 8,113,050 | B2 | 2/2012 | Acar et al. |
| 8,256,290 | B2 | 9/2012 | Mao |
| 8,322,213 | B2 | 12/2012 | Trusov et al. |
| 8,342,023 | B2 | 1/2013 | Wolfram et al. |
| 8,347,717 | B2 | 1/2013 | Seeger et al. |
| 8,429,970 | B2 | 4/2013 | Rocchi |
| 8,459,110 | B2 | 6/2013 | Cazzaniga et al. |
| 8,479,575 | B2 | 7/2013 | Kempe |
| 8,544,594 | B2 | 10/2013 | Yacine |
| 8,640,541 | B2 | 2/2014 | Aziz et al. |
| 8,661,897 | B2 | 3/2014 | Coronato et al. |
| 8,661,898 | B2 | 3/2014 | Watson |
| 8,733,172 | B2 | 5/2014 | Coronato et al. |
| 8,789,416 | B2 | 7/2014 | Rocchi |
| 8,794,066 | B2 | 8/2014 | Merz et al. |
| 9,157,740 | B2 | 10/2015 | Kempe |
| 9,194,704 | B2 | 11/2015 | Lin et al. |
| 9,322,213 | B2 | 4/2016 | Wang et al. |
| 2005/0229703 | A1* | 10/2005 | Geen ................. G01C 19/5719 73/510 |
| 2006/0032310 | A1 | 2/2006 | Merassi et al. |
| 2009/0064781 | A1* | 3/2009 | Ayazi ................. G01C 19/5719 73/504.12 |
| 2009/0192403 | A1 | 7/2009 | Gharib et al. |
| 2010/0095768 | A1 | 4/2010 | Acar et al. |
| 2010/0107391 | A1 | 5/2010 | Lasalandra et al. |
| 2010/0223996 | A1 | 9/2010 | Fukumoto |
| 2010/0313657 | A1* | 12/2010 | Trusov ................. G01C 19/5719 73/504.16 |
| 2011/0270569 | A1 | 11/2011 | Stephanou et al. |
| 2011/0303007 | A1 | 12/2011 | Rocchi |
| 2012/0013355 | A1* | 1/2012 | Narita ................. G01C 19/574 324/679 |
| 2012/0017677 | A1 | 1/2012 | Merz et al. |
| 2012/0024056 | A1 | 2/2012 | Hammer |
| 2012/0031977 | A1 | 2/2012 | Havens et al. |
| 2012/0048017 | A1 | 3/2012 | Kempe |
| 2012/0210788 | A1 | 8/2012 | Günther et al. |
| 2012/0291548 | A1 | 11/2012 | Kanemoto |
| 2013/0031977 | A1 | 2/2013 | Kempe |
| 2013/0098153 | A1 | 4/2013 | Trusov et al. |
| 2013/0125649 | A1 | 5/2013 | Simoni et al. |
| 2013/0167636 | A1 | 7/2013 | Coronato et al. |
| 2013/0192363 | A1 | 8/2013 | Loreck et al. |
| 2013/0192365 | A1 | 8/2013 | Zhuang et al. |
| 2013/0283908 | A1 | 10/2013 | Geen et al. |
| 2014/0047921 | A1 | 2/2014 | Seeger et al. |
| 2014/0116135 | A1 | 5/2014 | Cazzaniga et al. |
| 2014/0116136 | A1 | 5/2014 | Coronato et al. |
| 2014/0352431 | A1 | 12/2014 | Leclerc |
| 2015/0211854 | A1* | 7/2015 | Ruohio ................. G01C 19/5712 73/504.12 |
| 2015/0330783 | A1* | 11/2015 | Rocchi ................. G01C 19/5747 73/504.12 |
| 2015/0377621 | A1 | 12/2015 | Chaumet et al. |
| 2016/0025492 | A1 | 1/2016 | Rocchi |
| 2016/0084654 | A1 | 3/2016 | Senkal et al. |
| 2017/0184400 | A1* | 6/2017 | Valzasina ................. G01C 19/574 |

FOREIGN PATENT DOCUMENTS

| | | |
|---|---|---|
| CN | 101261126 B | 6/2010 |
| CN | 101363731 B | 1/2011 |
| CN | 201945318 U | 8/2011 |
| CN | 102305626 A | 1/2012 |
| CN | 102636162 A | 8/2012 |
| CN | 202793402 U | 3/2013 |
| CN | 102278982 B | 7/2013 |
| CN | 103217151 A | 7/2013 |
| CN | 103575263 A | 2/2014 |
| CN | 103213939 B | 1/2016 |
| EP | 786645 A2 | 7/1997 |
| EP | 1432962 A1 | 6/2004 |
| EP | 1603830 A1 | 12/2005 |
| EP | 1899681 B1 | 5/2009 |
| EP | 1697696 B1 | 1/2010 |
| EP | 2160566 B1 | 12/2011 |
| EP | 3187825 A1 | 7/2017 |
| JP | 2008145325 A | 6/2008 |
| JP | 2010096695 A | 4/2010 |
| JP | 4702942 B2 | 6/2011 |
| JP | 5030135 B2 | 9/2012 |
| RU | 2222780 C1 | 1/2004 |
| RU | 2234679 C2 | 8/2004 |
| RU | 2251077 C1 | 4/2005 |
| RU | 2423668 C1 | 7/2011 |
| WO | 2009003541 A1 | 1/2009 |
| WO | 2009107573 A1 | 9/2009 |
| WO | 2011136970 A1 | 11/2011 |
| WO | 2013083534 A2 | 6/2013 |
| WO | 2013091866 A1 | 6/2013 |
| WO | 2013108804 A1 | 7/2013 |

OTHER PUBLICATIONS

Zhang et al., "Optimal Design of a Center Support Quadruple Mass Gyroscope (CSQMG)", "Engineering Research Center for Navigation Technology, Department of Precision Instruments", Apr. 28, 2016, pp. 1-16, vol. 16, No. 613, Publisher: Sensors 2016, Published in: Tsinghua University, Beijing 100084, China.

Zhou et al, "Innovationn of Flat Gyro: Center Support Quadruple Mass Gyroscope", "2016 IEEE International Symposium on Inertial Sensors and Systems", Mar. 21, 2016, pp. 1-4, Publisher: Date of Conference: Feb. 22-25, 2016.

Zhang, Tian et al, "Optimal Design of a Center Support Quadruple Mass Gyroscope (CSQMG)", "Sensors", Apr. 28, 2016, pp. 1-16, Publisher: MDPI.

Zhou, Bin et al, "Innovation of Flat Gyro: Center Support Quadruple Mass Gyroscope", 2016, pp. 1-4, Publisher: IEEE.

European Patent Office, "European Office Action Communication pursuant to Article 94(3) from EP Application No. 17162859.7 dated Aug. 17, 2018", "from Foreign Counterpart of U.S. Appl. No. 15/466,784", dated Aug. 17, 2018, pp. 1-6, Published in: EP.

European Patent Office, "Extended European Search Report for EP Application No. 17162684.9", "Foreign Counterpart to U.S. Appl. No. 15/466,778", dated Sep. 25, 2017, pp. 1-8, Published in: EP.

European Patent Office, "Extended European Search Report for EP Application No. 17162859.7", "Foreign Counterpart to U.S. Appl. No. 15/466,784", dated Sep. 26, 2017, pp. 1-9, Published in: EP.

European Patent Office, "European Office Action Communication pursuant to Article 94(3) from EP Application No. 17162684.9 dated Nov. 14, 2018", "from Foreign Counterpart of U.S. Appl. No. 15/466,778", dated Nov. 14, 2018, pp. 1-8, Published in: EP.

United States Patent and Trademark Office, "Office Action", "from (56) References Cited

OTHER PUBLICATIONS

U.S. Appl. No. 15/466,784", Nov. 15, 2018, pp. 1-16, Published in: US.

* cited by examiner

SYSTEMS AND METHODS FOR BIAS SUPPRESSION IN A NON-DEGENERATE MEMS SENSOR

CROSS REFERENCE TO RELATED APPLICATIONS

This application claims the benefit of U.S. Provisional Patent Application Ser. No. 62/342,132, filed on May 26, 2016, which is hereby incorporated herein by reference.

STATEMENT REGARDING FEDERALLY SPONSORED RESEARCH OR DEVELOPMENT

This invention was made with Government support under Government Contract Number HR0011-16-9-0001 awarded by DARPA. The Government has certain rights in the invention.

BACKGROUND

Certain navigational applications have a need for high precision gyroscopes. For example, MEMS gyroscopes may be capable of providing high precision measurements. However, certain MEMS gyroscopes may be subject to bias errors, where the bias errors may be represented by a non-zero y-intercept of the plot of output signal vs. input rotational rate. A non-zero sensor bias may directly affect the navigation algorithms that rely on inertial sensing data. For instance, a non-zero bias may cause inertial sensors to indicate that an associated system is rotating when the system is actually stationary; the bias errors may lead to a navigation solution error that increases cubically with time. The bias errors may negatively affect the operation of inertial sensors used in GPS redundant airplane navigation and gyrocompassing (using the earth's rotation rate to locate the North Pole), where the GPS redundant airplane and gyrocompassing applications rely on inertial sensors with very low output biases.

One example of a MEMS gyroscope that is susceptible to bias errors is a tuning fork gyroscope. A tuning fork gyroscope consists of two proof masses which vibrate in an anti-phase mode with each other (driven axis). A tuning fork gyroscope measures rotation through the Coriolis effect which generates a force that is perpendicular to both the axis of rotation (input axis) and the velocity of the proof mass. Since the proof masses are driven in an anti-phase mode, when rotation is applied, the proof masses respond by moving in anti-phase along the axis of the Coriolis force (sense axis). The motion of the proof masses occurs at the drive frequency, where the drive frequency is the resonant frequency of the proof masses in the driven axis.

The bias error in the tuning fork gyroscope occurs due to vibratory rotation motion about the input axis at the driven frequency. The vibratory rotation causes the proof masses to move in the sense axis of the gyro at the driven frequency and generates a bias error signal. This vibratory rotation motion could occur through several mechanisms. One exemplary mechanism would be an excitation of rotational vibration in the circuit board which controls the tuning fork gyroscope. In this case, an imbalance in the driven motion of the sensor imparts force onto the circuit board, which in turn generates a rotational vibration.

SUMMARY

Systems and methods for suppressing bias errors in a non-degenerate vibratory structure are provided. In certain embodiments, a vibratory structure includes a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Systems and methods for reducing imbalance driven bias errors are herein disclosed. For example, the imbalance driven bias errors may be reduced by fabricating a MEMS sensor such that the motion of the proof masses in the sense direction contains zero angular momentum. In certain implementations, the MEMS sensor may be a MEMS sensor having proof masses that are driven in anti-phase in the different vibration axes. In at least one embodiment, the MEMS sensor may be a non-degenerate MEMS sensor, where the proof masses have different frequencies for the anti-phase modes in the drive and sense direction. In at least one example, the MEMS sensor may have substantially zero angular momentum in the sense motion when the MEMS sensor has an inner proof mass within an outer proof mass where the inner proof mass and outer proof mass are symmetric across both the x and y axes.

Figure 1:
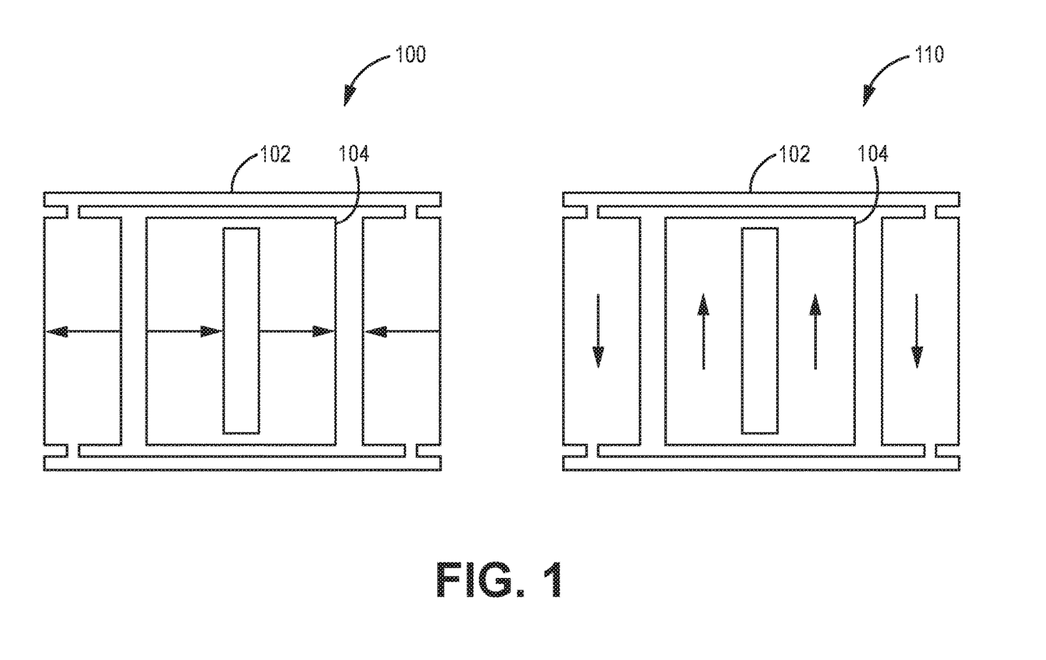
FIG. 1 is a diagram illustrating different vibratory modes for vibratory structure according to exemplary embodiments described herein.

FIG. 1 is a diagram of a MEMS sensor 100 having two proof-masses that vibrate with zero angular momentum. For example, the MEMS sensor may have an outer proof mass 102 and an inner proof mass 104 where the different proof masses vibrate in opposite directions along different axes. For example, when the MEMS sensor 110 experiences motion along a sense axis, the two proof masses vibrate with zero angular momentum. Further, as illustrated by the MEMS sensor 100, when the inner proof mass 104 experiences motion in one direction along the motor axis, the outer proof mass 102 experiences motion in the opposite direction along the motor axis. Similarly, as illustrated by the MEMS sensor 110 that shows motion along the sense axis, the outer proof mass 102 moves in an opposite direction when compared to the motion experienced by the inner proof mass 104.

Figure 2:
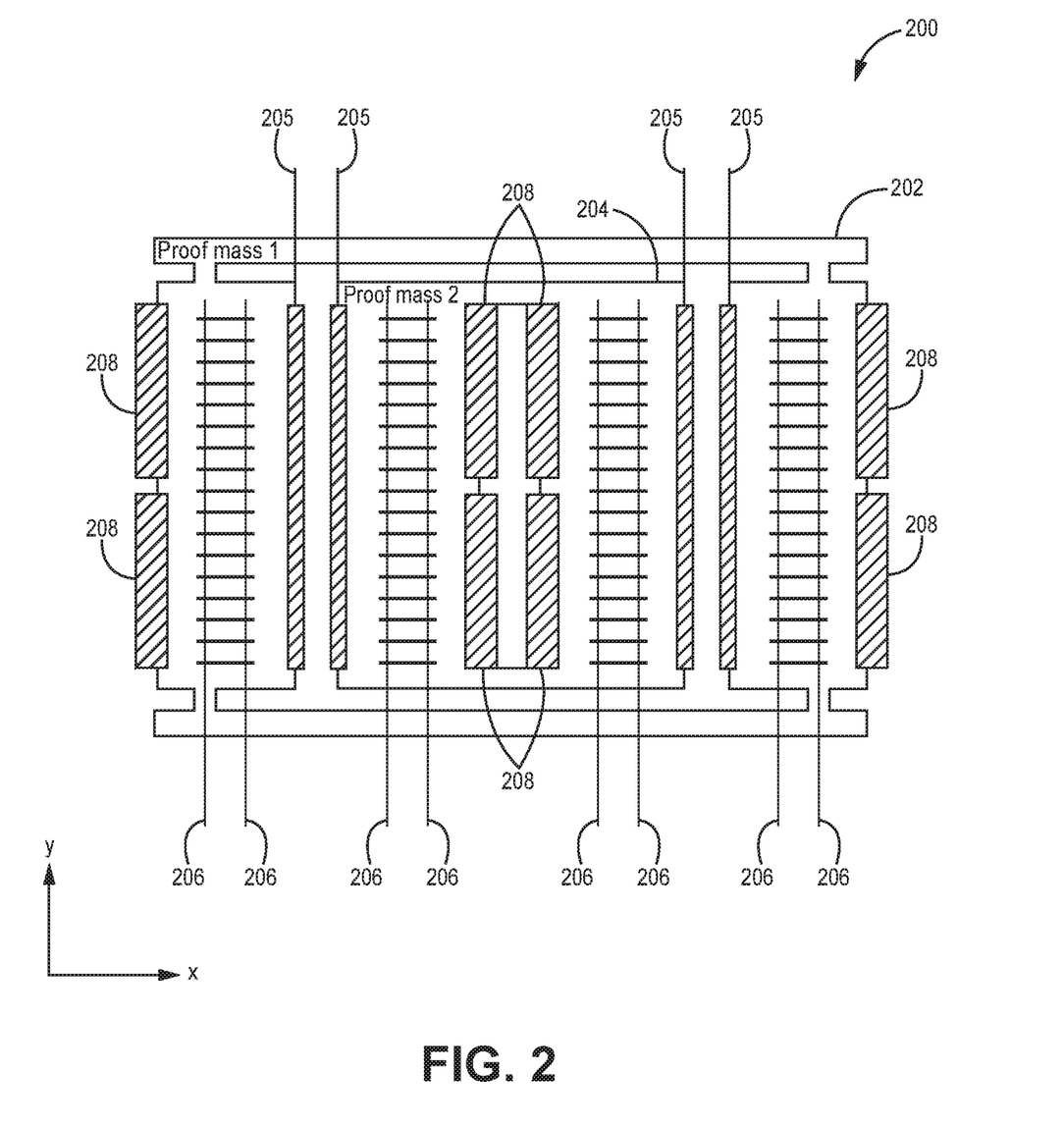
FIG. 2 is a diagram of a MEMS sensor with two-mass box-in-frame proof masses according to exemplary embodiments described herein.

FIG. 2 illustrates a further example of MEMS sensor where the two proof masses vibrate with zero angular momentum. In particular MEMS sensor 200 provides an example of a box-in-frame MEMS sensor having proof masses 202 and 204. For example, the MEMS sensor 200 includes an outer proof mass 202 and an inner proof mass 204. In certain implementations, the center of mass of the outer proof mass 202 and the center of mass of the inner proof mass 204 may be aligned with one another. When both the outer proof mass 202 and the inner proof mass 204 have center of masses that are aligned with one another, the proof masses may not be as susceptible to errors that may arise in a typical two proof mass sensor, where the two proof masses are on opposite sides of their combined center of mass of the MEMS sensor. As illustrated, the outer proof mass 202 and the inner proof mass 204 may vibrate in such a way so that there is zero angular momentum in the sense axis. If vibratory motion occurs for the typical two proof mass sensor with masses on opposite sides of their combined center of mass, during the vibratory motion, one proof mass will move up while the other moves down. This response will be identical to the response of the proof masses to the Coriolis force and therefore the vibratory motion will result in sensor bias. The aligning of the centers of mass cause both proof masses to respond to vibratory rotation motion in a way that does not produce output bias and preserves zero angular momentum in the sense axis. As the inner proof mass 204 responds to vibratory rotation motion, one side of the inner proof 204 mass will move up while the other moves down. Since sensor output is only generated when both sides of the inner proof mass 204 move in the same direction, the vibratory rotation effect will not generate bias. The outer proof mass 202 moves similarly to the inner proof mass 204, and thus also does not generate bias.

As illustrated in FIG. 2, the outer proof mass 202 and the inner proof mass 204 have drive combs 208 positioned on the proof masses 202 and 204. The drive combs 208 cause the different proof masses to vibrate along a driven axis in an anti-phase mode with each other. For example, if the proof masses 202 and 204 are driven along the x-axis, when the inner proof mass 204 moves towards the positive x direction, the outer proof mass 202 moves towards the negative x direction. Also, when the inner proof mass 204 moves towards the negative x direction, the outer proof mass 202 moves towards the positive x direction. The drive combs 208 may be implemented as capacitive plates, capacitive combs, piezo-suspensions, magnetic drives, and the like. In one or more implementations, one or both of the outer proof mass 202 and the inner proof mass 204 may include a first section and a second section that may be located on opposite sides of the center of mass, where the first and the second section are connected to one another through a first and second crossbar, where the first and second crossbars connect the first section to the second section such that the first and second crossbars are positioned symmetrically about the same center of mass.

In certain embodiments, the MEMS sensor 200 is equipped with sense electrodes on a substrate that sense the movement of the proof masses 202 and 204. The sense electrodes may sense the movement based on capacitance, magnetics, piezoresistivity, and the like. Accordingly, as the drive combs cause the proof masses 202 and 204 to vibrate along the x direction, the sense electrodes are able to sense the motion of the proof masses 202 and 204 with respect to a substrate. Connections 205 represent connections to sense electrodes that sense motion in the x direction and connections 206 represent connection to sense electrodes that sense motion in the y direction. The connections 205 and 206 provide measurements of motion to a processing unit, where the processing unit uses the measurements to calculate information that can be used for a navigation rate.

Figure 3:
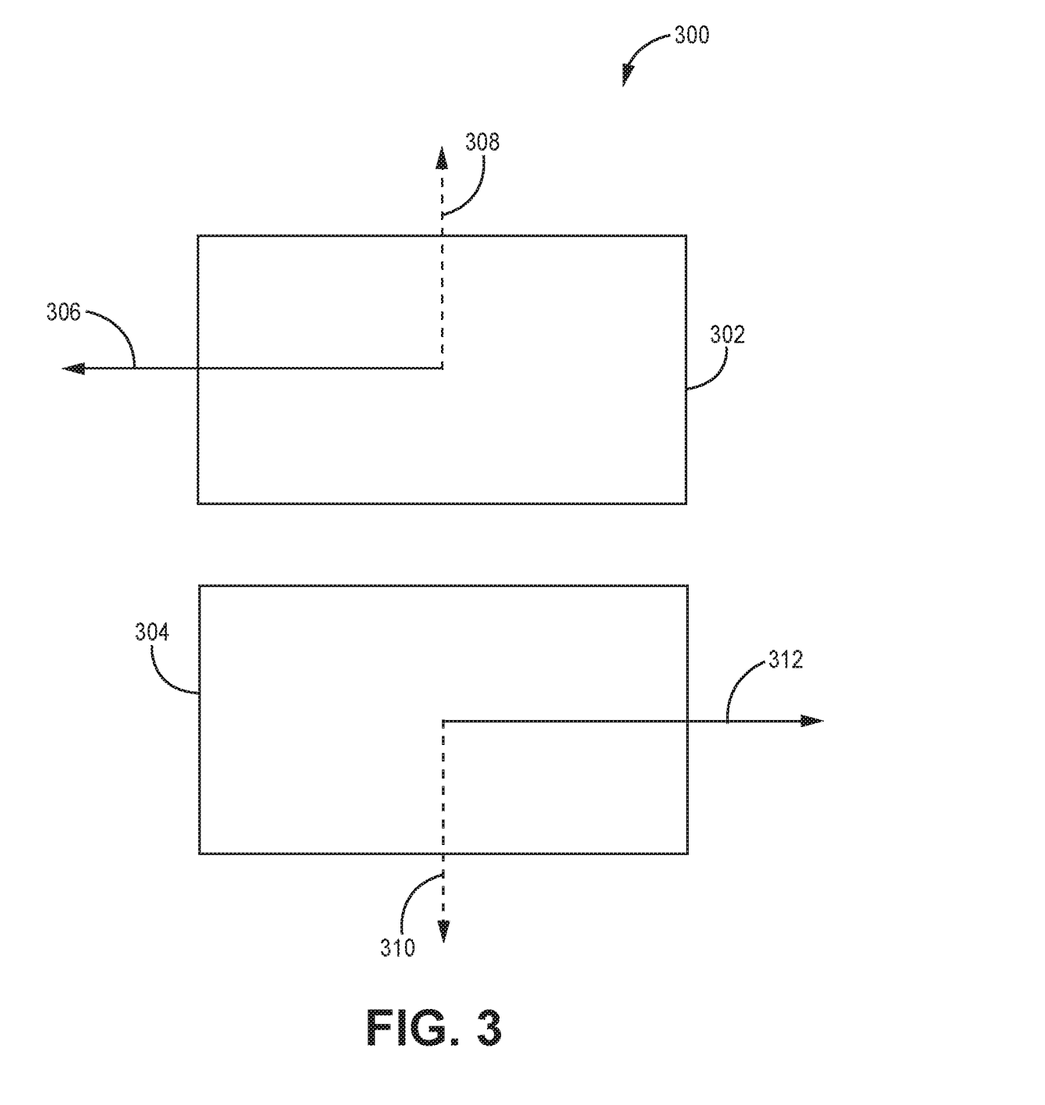
FIG. 3 is a diagram illustrating vibratory modes for a vibratory structure having two proof masses according to exemplary embodiments described herein.

FIG. 3 is a further diagram illustrating a MEMS sensor 300 having two proof masses that vibrate with zero-angular momentum in the sense axis. For example, the MEMS sensor 300 includes a first proof mass 302 and a second proof mass 304. The first proof mass 302 and the second proof mass 304 are of equal size and vibrate along respective drive and sense axes. For example, the first proof mass 302 is driven along drive axis 306 and vibrates along sense axis 308. Also, the second proof mass 304 is driven along drive axis 312 and vibrates along sense axis 308. The motion of both the first proof mass 302 and the second proof mass 304 is such that the MEMS sensor 300 has substantially zero angular momentum as the proof masses 302 and 304 move along their respective sense axes 308 and 310.

Figure 4:
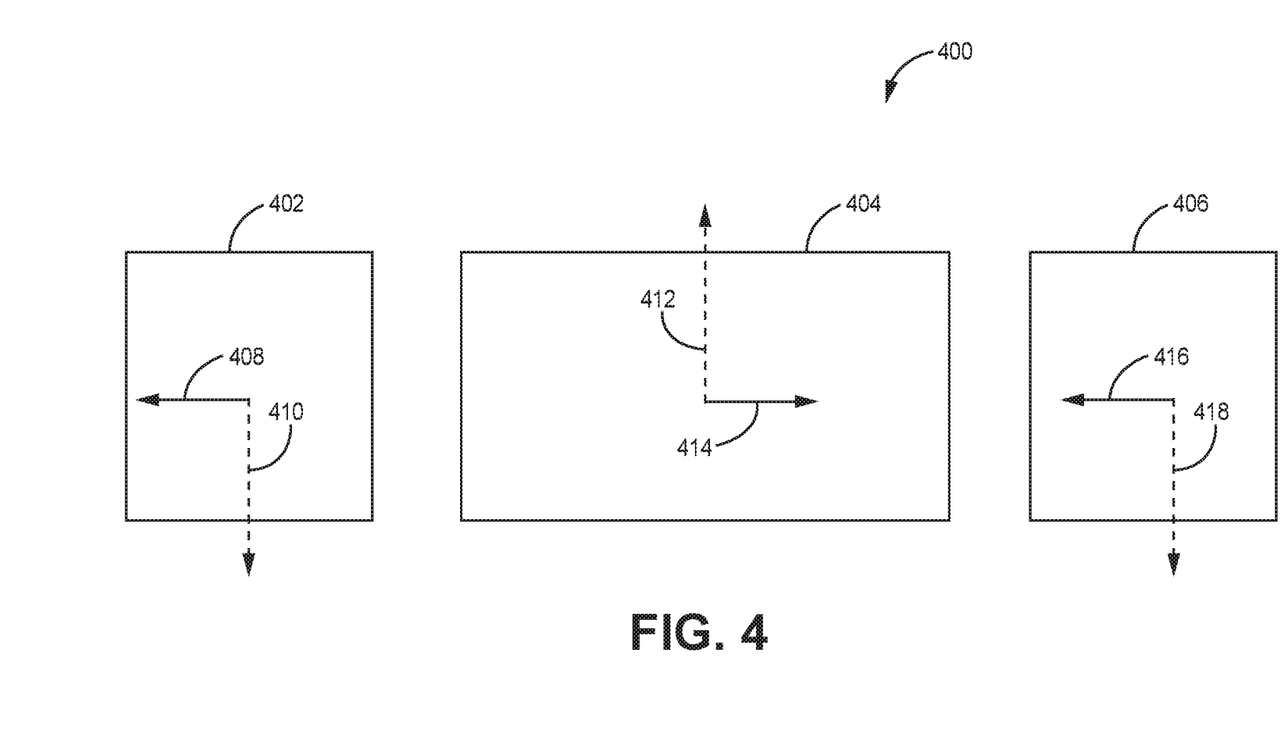
FIG. 4 is a diagram illustrating vibratory modes for a vibratory structure having three proof masses according to exemplary embodiments described herein.

FIG. 4 is a further diagram illustrating a MEMS sensor 400 having three proof masses that vibrate with substantially zero-angular momentum in the sense axis. For example, the MEMS sensor 400 includes a first proof mass 402, a second proof mass 404, and a third proof mass 406. The first proof mass 402 and the third proof mass 406 are of equal size and the second proof mass 404 is the same size of the combined sizes of the first proof mass 402 and the third proof mass 406. The first proof mass 402 is driven along drive axis 408 and vibrates along sense axis 410. The second proof mass 404 is driven along drive axis 412 and vibrates along sense axis 414. The third proof mass 406 is driven along drive axis 416 and vibrates along sense axis 418. The motion of the second proof mass 404 is such that it balances the motion of the first proof mass 402 and third proof mass 406 such that there is substantially zero angular momentum along the sense axes within the MEMS sensor 300.

Figure 5:
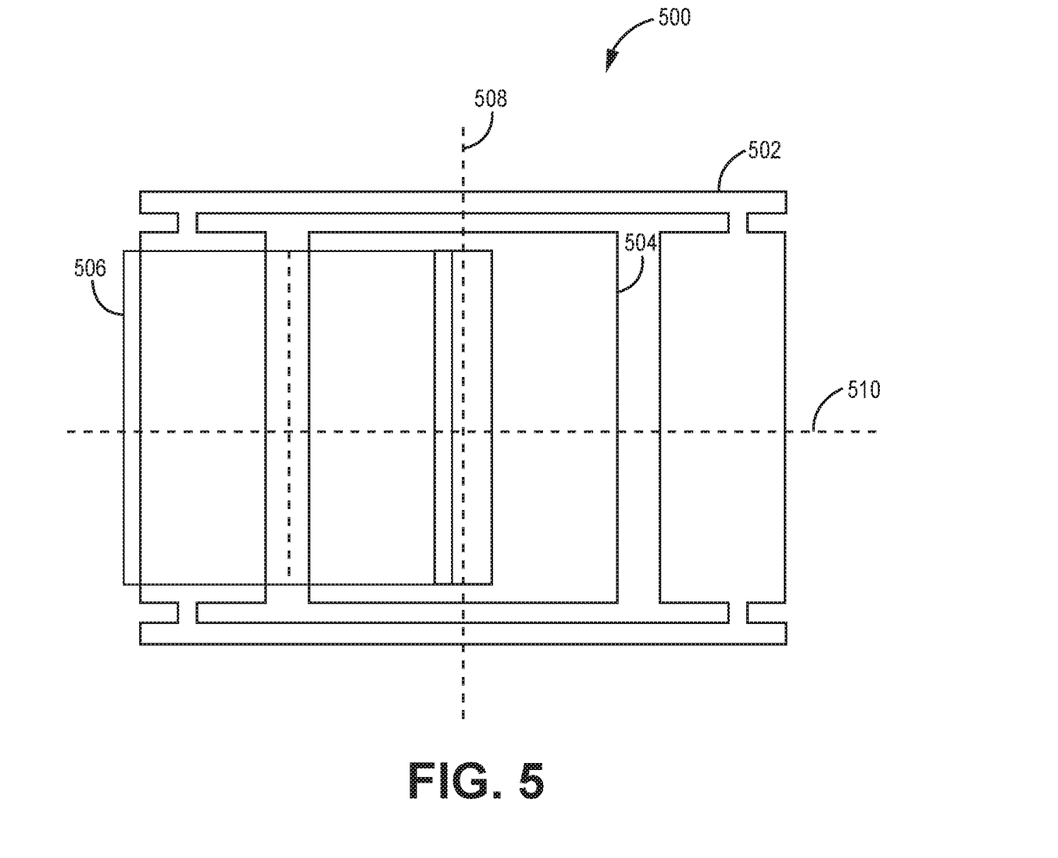
FIG. 5 is a diagram illustrating different axes of symmetry for MEMS sensors according to exemplary embodiments described herein.
Figure 6:
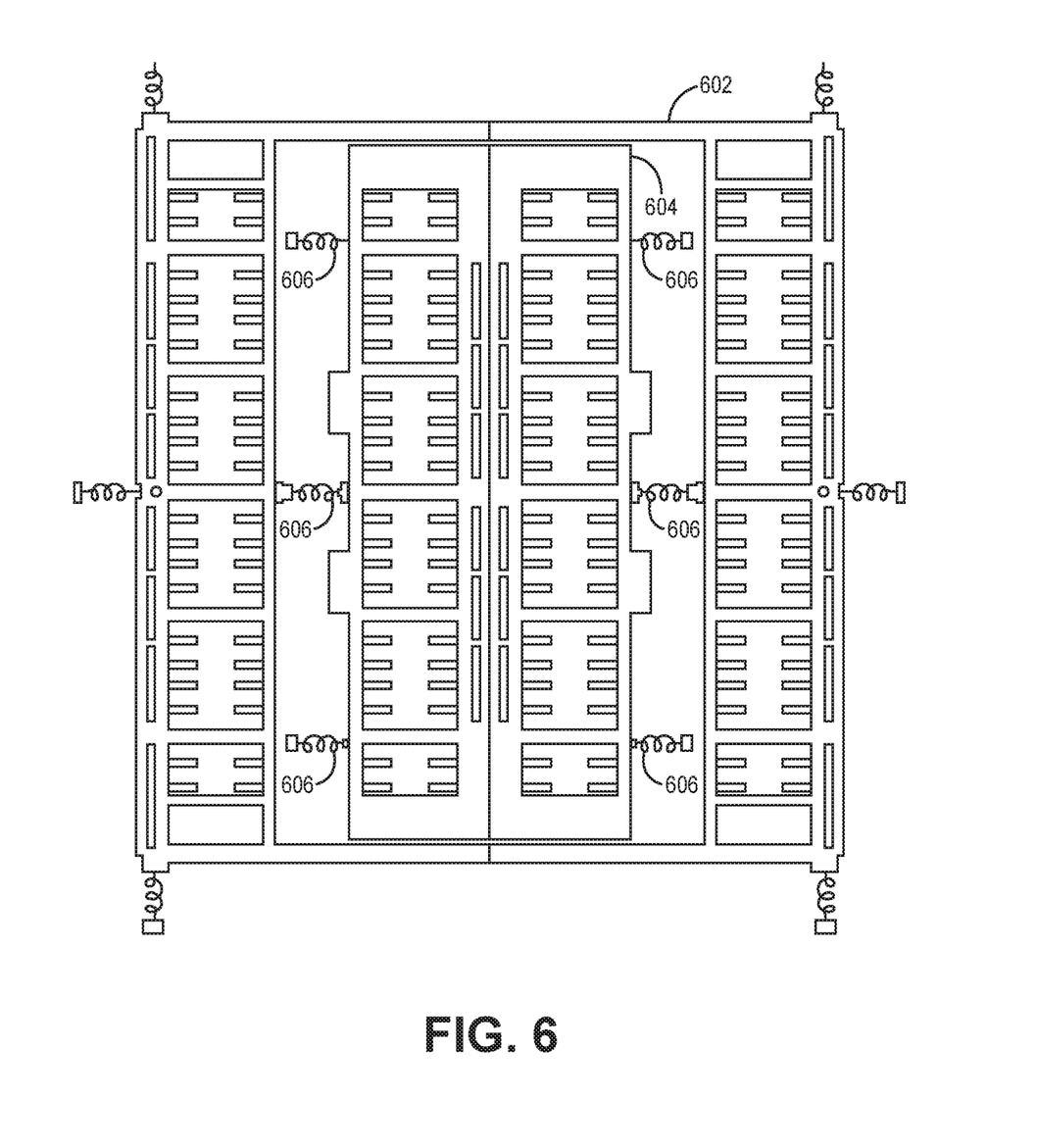
FIG. 6 is a diagram illustrating flexures for a MEMS sensor having two-mass box-in-frame proof masses according to exemplary embodiments described herein.

FIG. 5 is a diagram illustrating a MEMS sensor 500 having different lines of symmetry for the arrangement of the outer proof mass 502 and the inner proof mass 504. As illustrated, the arrangement illustrated has multiple lines of symmetry. For example, the arrangement of proof masses has local symmetry 506, wherein one side of the inner proof mass 504 is symmetric with the most proximate side of the outer proof mass 502. Also, each of the proof masses 502 and 504 are symmetrical about two orthogonal axes, axes 508 and 510, that pass through the center of mass. For example, a first vertical half of the MEMS sensor 500 is symmetrical with a second vertical half of the MEMS sensor 500 about a vertical axis 508 that passes through the center of mass of the MEMS sensor 500. Also, a first horizontal half of MEMS sensor 500 is symmetrical with a second horizontal half of the MEMS sensor 500 about a horizontal axis 510. The terms horizontal and vertical are relative terms that indicate that the horizontal axes is orthogonal to the vertical axis, however, the axes are not necessarily horizontal or vertical FIG. 6 illustrates the flexures and anchors 606 of a MEMS sensor 600 that are used to mount the inner proof mass 604 and outer proof mass 602 to a substrate. For example, the flexures connect the inner proof mass 604 to the outer proof mass 602 and the flexures also connect the inner proof mass 604 and the outer proof mass 602 to the anchors 606. The flexures may be spring type flexures or other type of flexure known to one having skill in the art. In at least one implementation, the flexures may be designed for zero net force on the anchors 606. Alternatively, the flexures may be designed for a non-zero net force on the anchors 606. Further, in certain implementations, directly coupling flexures between proof masses may provide sense mode separation from symmetric translation.

Figure 7:
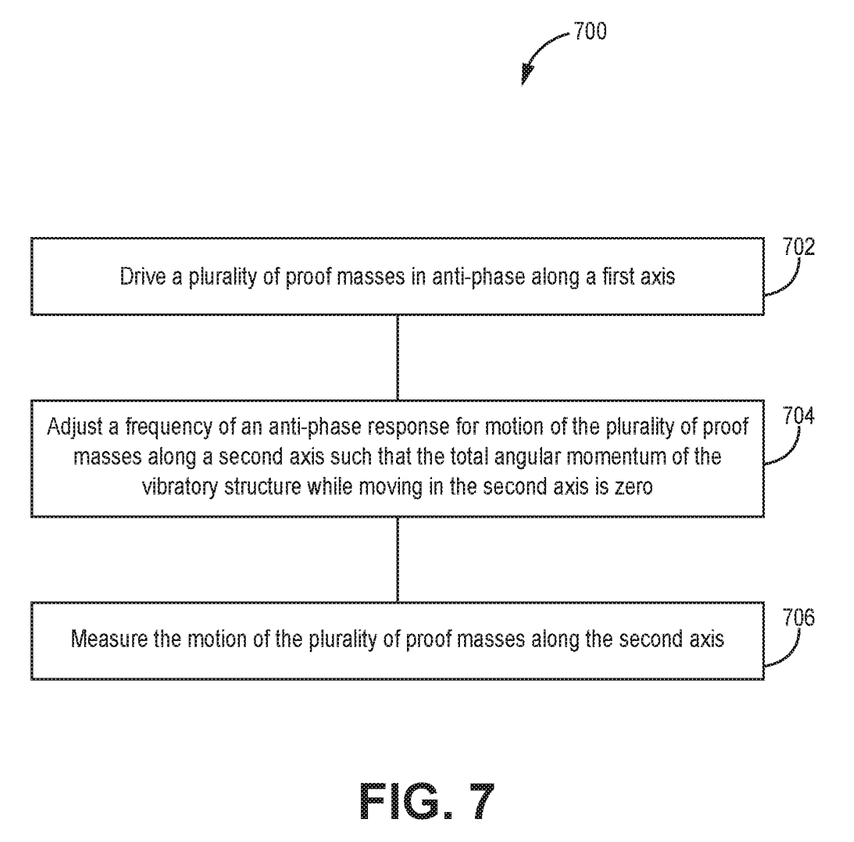
FIG. 7 is a flow diagram for a method for suppressing imbalance driven bias errors according to exemplary embodiments described herein.

FIG. 7 is a flow diagram illustrating a method 700 for suppressing imbalance driven bias errors in a MEMS sensor. For example, method 700 proceeds at 702, where a plurality of proof masses are driven in anti-phase along a first axis. Further, method 700 may proceed at 704, where a frequency of an anti-phase response for motion of the plurality of proof masses along a second axis is adjusted such that the total angular momentum of the vibratory structure while moving in the second axis is zero, wherein the second axis is orthogonal to the first axis. Also, method 700 may proceed at 706, where the motion of the plurality of proof masses along the second axis may be measured.

EXAMPLE EMBODIMENTS

Example 1 includes a vibratory structure, the vibratory structure comprising: a first proof mass; a second proof mass, wherein the first proof mass and the second proof mass are driven into motion along a first axis, wherein the first proof mass and the second proof mass move in anti-phase along a second axis, wherein the motion of the first proof mass and the second proof mass along the second axis is such that the centers of mass of the first proof mass and the second proof mass move collinearly along a same axis.

Example 2 includes the vibratory structure of Example 1, wherein the motion of the first proof mass and the second proof mass is such that the total angular momentum of the vibratory structure while moving along the second axis is zero.

Example 3 includes the vibratory structure of any of Examples 1-2, wherein the resonant frequencies of the motion along the first axis and the second axis are non-degenerate.

Example 4 includes the vibratory structure of any of Examples 1-3, wherein the structure is a MEMS sensor.

Example 5 includes the vibratory structure of any of Examples 1-4, wherein the motion of the proof masses in the second axis is determined to produce an output proportional to a measured quantity.

Example 6 includes the vibratory structure of Example 5, wherein the measured quantity is a measure of rotation rate.

Example 7 includes the vibratory structure of any of Examples 1-6, further comprising a third proof mass, wherein the first proof mass, the second proof mass, and the third proof mass are driven in a first axis, and the motion of the second proof mass and third proof mass is along the second axis.

Example 8 includes the vibratory structure of any of Examples 1-7, wherein the first proof mass comprises first proof mass drive combs and/or the second proof mass comprises second proof mass drive combs.

Example 9 includes the vibratory structure of any of Examples 1-8, further comprising a substrate, wherein a plurality of sense electrodes are mounted on the substrate.

Example 10 includes the vibratory structure of Example 9, further comprising a plurality of anchors mounted on the substrate, wherein the anchors are coupled to the first proof mass and/or the second proof mass through a plurality of flexures.

Example 11 includes the vibratory structure of any of Examples 1-10, wherein a first side of the first proof mass is locally symmetrical with a first side of the second proof mass and a second side of the first proof mass is locally symmetrical with a second side of the second proof mass, wherein, the first side of the first proof mass is proximate to the first side of the second proof mass and the second side of the first proof mass is proximate to the second side of the second proof mass.

Example 12 includes a method for suppressing bias errors in a vibratory structure, the method comprising: driving a plurality of proof masses in anti-phase along a first axis; adjusting a frequency of an anti-phase response for motion of plurality of proof masses along a second axis such that the total angular momentum of the vibratory structure while moving in the second axis is zero, wherein the second axis is orthogonal to the first axis; and measuring the motion of the plurality of proof masses along the second axis.

Example 13 includes the method of Example 12, wherein the motion of the plurality of proof masses is such that the centers of mass for each proof mass in the plurality of proof masses move collinearly along a same axis.

Example 14 includes the method of any of Examples 12-13, wherein the resonant frequencies of the motion along the first axis and the second axis are non-degenerate.

Example 15 includes the method of any of Examples 12-14, wherein the vibratory structure is a MEMS sensor.

Example 16 includes the method of any of Examples 12-15, wherein the motion of the plurality proof masses along the second axis is determined to produce an output proportional to a measured quantity.

Example 17 includes the method of Example 16, wherein the measured quantity is a measure of rotation rate.

Example 18 includes a vibratory structure, the vibratory structure comprising: a substrate; a first proof mass; a second proof mass, wherein the first and second proof mass are driven along a first axis, wherein the first and second proof mass move in anti-phase in a second axis, wherein the motion of the two proof masses along the second axis is such that the total angular momentum of the vibratory structure while moving in the second axis is zero; a plurality of anchors mounted on the substrate; a plurality of flexures, wherein the anchors are coupled to the first proof mass and the second proof mass through the plurality of flexures; and a plurality of sense electrodes mounted on the substrate, wherein the plurality of sense electrodes sense motion of the first proof mass and the second proof mass in the second axis.

Example 19 includes the vibratory structure of Example 18, wherein the motion of the plurality of proof masses is such that the centers of mass for each proof mass in the plurality of proof masses move collinearly along a same axis.

Example 20 includes the vibratory structure of any of Examples 18-19, wherein the resonant frequencies of the motion along the first axis and the second axis are non-degenerate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:

1. A MEMS sensor, comprising:
a first proof mass;
a third proof mass of substantially equal size to the first proof mass;
a second proof mass of substantially equal size to the combined sizes of the first proof mass and the third proof mass;
at least one rigid member directly connected between the first proof mass and the third proof mass;
wherein the first proof mass and the third proof mass are configured to be driven along a drive axis in phase relative to each other;
wherein the second proof mass is configured to be driven along the drive axis in anti-phase relative to the first and third proof masses;
wherein the first proof mass and the third proof mass are configured to move in anti-phase relative to the second proof mass along respective sense axes; and
wherein the motion of the second proof mass is configured to balance the motions of the first proof mass and the third proof mass such that an input-axis component of a total angular momentum in the respective motions along the sense axes is zero.

2. The MEMS sensor of claim 1, wherein resonant frequencies of the motions along the drive axis and the sense axes are non-degenerate.

3. The MEMS sensor of claim 1, further comprising a circuit configured to determine the motions of the proof masses in the respective sense axes and to produce, in response to the determined motions, an output proportional to a measured quantity.

4. The MEMS sensor of claim 3, wherein the measured quantity is a measure of rotation rate.

5. The MEMS sensor of claim 1, wherein the first proof mass comprises first proof-mass drive combs and/or the second proof mass comprises second proof-mass drive combs.

6. The MEMS sensor of claim 1, further comprising a substrate, and a plurality of sense electrodes mounted on the substrate.

7. The MEMS sensor of claim 6, further comprising a plurality of anchors mounted on the substrate and coupled to the first proof mass and/or the second proof mass through a plurality of flexures.

8. The MEMS sensor of claim 1, wherein a first side of the first proof mass is locally symmetrical with a first side of the third proof mass and a second side of the first proof mass is locally symmetrical with a second side of the third proof mass, wherein, the first side of the first proof mass is proximate to the first side of the third proof mass and the second side of the first proof mass is proximate to the second side of the third proof mass.

9. A method for suppressing bias errors in a MEMS sensor, the method comprising:
driving an inner one of at least three proof masses along a drive axis;
driving an outer two of the at least three proof masses along the drive axis in phase relative to each other and in anti-phase relative to the inner one of the at least three proof masses, the outer two of the at least three proof masses being directly interconnected by at least one rigid member;
adjusting a frequency of an anti-phase response for a motion of the at least three proof masses along respective sense axes orthogonal to the drive axis such that an input-axis component of a total angular momentum in the motion of the at least three proof masses along the respective sense axes is substantially zero; and
measuring the respective motions of the at least three proof masses along the sense axes.

10. The method of claim 9, wherein the respective motions of the at least three proof masses are such that the respective centers of mass for the at least three proof masses move collinearly along a same axis.

11. The method of claim 9, wherein the resonant frequencies of the motions along the drive axis and the sense axes are non-degenerate.

12. The method of claim 9, wherein the respective motions of the at least three proof masses along the sense axes are determined to produce an output proportional to a measured quantity.

13. The method of claim 12, wherein the measured quantity is a measure of rotation rate.

14. A vibratory structure, comprising:
a substrate;
a first outer proof mass configured to be driven along a first axis;
a second outer proof mass configured to be driven along the first axis in phase relative to the first outer proof mass;
a rigid member interconnecting the first outer proof mass directly to the second outer proof mass;
an inner proof mass configured to be driven along the first axis in anti-phase relative to the first and second outer proof masses;
wherein the first outer proof mass and the second outer proof mass are configured to move in anti-phase in respective second axes;
wherein the first and second outer proof masses and the inner proof mass are configured such that motions of the first and second outer proof masses and the inner proof mass along the respective second axes are such that an input-axis component of a total angular momentum in the motions along the second axes is approximately zero;
a plurality of anchors mounted on the substrate;
a plurality of flexures, wherein the anchors are coupled to the first outer proof mass and the second outer proof mass through the plurality of flexures; and
a plurality of sense electrodes mounted on the substrate and configured to sense the motions of the first outer proof mass and the second outer proof mass in the respective second axes.

15. The vibratory structure of claim 14, wherein the first and second outer proof masses and the inner proof mass are configured such that respective centers of mass for the first and second outer proof masses and the inner proof mass move collinearly along the first axis.

16. The vibratory structure of claim 14, wherein resonant frequencies of the motions along the first axis and the second axes are non-degenerate.

17. The MEMS sensor of claim 1, wherein the first proof mass, the second proof mass, and the third proof mass are configured such that respective centers of mass of the first proof mass, the second proof mass, and the third proof mass move collinearly along the drive axis.

\* \* \* \* \*